United States Patent
Gong et al.

(10) Patent No.: US 12,519,444 B2
(45) Date of Patent: Jan. 6, 2026

(54) METHOD FOR MANUFACTURING ACOUSTIC RESONATOR IN LATERAL EXCITATION SHEAR MODE

(71) Applicant: SPECTRON (SHENZHEN) TECHNOLOGIES CO., LTD, Guangdong (CN)

(72) Inventors: Songbin Gong, Shenzhen (CN); Ruochen Lv, Shenzhen (CN)

(73) Assignee: SPECTRON (SHENZHEN) TECHNOLOGIES CO., LTD, Guangdong (CN)

( * ) Notice: Subject to any disclaimer, the term of this patent is extended or adjusted under 35 U.S.C. 154(b) by 556 days.

(21) Appl. No.: 17/998,332

(22) PCT Filed: Mar. 31, 2021

(86) PCT No.: PCT/CN2021/084598
§ 371 (c)(1),
(2) Date: Nov. 9, 2022

(87) PCT Pub. No.: WO2022/183558
PCT Pub. Date: Sep. 9, 2022

(65) Prior Publication Data
US 2023/0231527 A1    Jul. 20, 2023

(30) Foreign Application Priority Data
Mar. 4, 2021    (CN) .......... 202110239485.X (51) Int. Cl.
H03H 3/02      (2006.01)
H03H 9/02      (2006.01)
H03H 9/17      (2006.01)

(52) U.S. Cl.
CPC .......... *H03H 3/02* (2013.01); *H03H 9/02031* (2013.01); *H03H 9/02228* (2013.01);
(Continued)

(58) Field of Classification Search
CPC .. H03H 3/02; H03H 9/02031; H03H 9/02228; H03H 9/175; H03H 9/176;
(Continued)

(56) References Cited

U.S. PATENT DOCUMENTS

| | | | |
|---|---|---|---|
| 6,437,668 B1 | 8/2002 | Nakao et al. | |
| 2002/0084873 A1* | 7/2002 | Ella | H03H 9/564 333/191 |

(Continued)

FOREIGN PATENT DOCUMENTS

| | | |
|---|---|---|
| CN | 1273458 A | 11/2000 |
| CN | 1365186 A | 8/2002 |

(Continued)

OTHER PUBLICATIONS

Second Office Action issued for Chinese Patent Application No. 202110239485.X, dated Mar. 7, 2024, 15 pages including English machine translation.

(Continued)

*Primary Examiner* — Jeffrey T Carley
*Assistant Examiner* — Jose K Abraham
(74) *Attorney, Agent, or Firm* — HSML P.C.

(57) ABSTRACT

The present disclosure relates to a method for fabricating a laterally excited shear mode acoustic resonator. The method includes: providing a piezoelectric layer including monocrystalline lithium niobate and/or monocrystalline lithium tantalate; forming an acoustic mirror on a first surface of the piezoelectric layer; the acoustic mirror including at least one first acoustic reflection layer and at least one second acoustic reflection layer, the first acoustic reflection layers and the second acoustic reflection layers being alternately superimposed, and acoustic impedance of each of the first acoustic reflection layers being less than that of each of the second acoustic reflection layers; bonding a bearing wafer on a first (Continued)

surface of the acoustic mirror; and forming an electrode unit and a lateral reflector on a second surface of the piezoelectric layer.

11 Claims, 7 Drawing Sheets

(52) U.S. Cl.
CPC .............. *H03H 9/175* (2013.01); *H03H 9/176* (2013.01); *H03H 2003/025* (2013.01)

(58) Field of Classification Search
CPC ......... H03H 2003/025; H03H 9/02015; H03H 9/02062; H03H 9/17; H03H 9/02; Y02D 30/70
See application file for complete search history.

(56) References Cited

U.S. PATENT DOCUMENTS

| | | | |
|---|---|---|---|
| 2004/0140869 A1* | 7/2004 | Marksteiner | H03H 9/175 333/189 |
| 2010/0301969 A1 | 12/2010 | Mukai et al. | |
| 2014/0152146 A1* | 6/2014 | Kimura | H10N 30/8542 29/25.35 |
| 2017/0288629 A1* | 10/2017 | Bhattacharjee | H03H 9/02275 |
| 2018/0205361 A1* | 7/2018 | Kishimoto | H03H 9/175 |
| 2020/0304091 A1 | 9/2020 | Yantchev | |
| 2021/0034935 A1 | 2/2021 | Ballandras et al. | |
| 2022/0014175 A1* | 1/2022 | Nagatomo | H03H 9/14541 |

FOREIGN PATENT DOCUMENTS

| | | | | |
|---|---|---|---|---|
| CN | 101902211 A | | 12/2010 | |
| CN | 107342748 A | | 11/2017 | |
| CN | 108463720 A | | 8/2018 | |
| CN | 109842397 A | | 6/2019 | |
| CN | 110120794 A | | 8/2019 | |
| CN | 110224680 A | | 9/2019 | |
| CN | 110572137 A | | 12/2019 | |
| CN | 111262551 A | | 6/2020 | |
| CN | 111371426 A | | 7/2020 | |
| CN | 111868745 A | | 10/2020 | |
| JP | 4548088 B2 | * | 9/2010 | |
| WO | WO-2012086441 A1 | * | 6/2012 | ......... H03H 9/02574 |
| WO | WO-2012086639 A1 | * | 6/2012 | ............... H03H 3/10 |

OTHER PUBLICATIONS

International Search Report issued for International Patent Application No. PCT/CN2021/084598, Date of mailing: Dec. 1, 2021, 8 pages including English translation.
Written Opinion issued for International Patent Application No. PCT/CN2021/084598, Date of mailing: Dec. 1, 2021, 5 pages including English machine translation.
Office Action issued for Chinese Patent Application No. 202110239485.X, dated Jun. 30, 2023, 7 pages.

\* cited by examiner

METHOD FOR MANUFACTURING ACOUSTIC RESONATOR IN LATERAL EXCITATION SHEAR MODE

This application is a national stage for International Application PCT/CN2021/084598, filed on Mar. 31, 2021, which claims the priority benefit of Chinese Patent Application No. 202110239485X, titled "METHOD FOR FABRICATING LATERALLY EXCITED SHEAR MODE ACOUSTIC RESONATOR" and filed on Mar. 4, 2021. The entireties of both applications are incorporated by reference herein for all purposes.

TECHNICAL HELD

The present disclosure relates to the field of resonator technologies, and more particularly, relates to a method for fabricating a laterally excited shear mode acoustic resonator.

BACKGROUND

Radio frequency acoustic resonators are small scale microfabricated structures used for synthesizing filtering functions or as frequency sources. Acoustic resonators have replaced other types of resonators used in mobile phones, small base stations, and internet of things (IoT) devices due to their smaller size and higher quality factor (Q). The acoustic resonators can achieve low loss (low power consumption), high suppression, a high signal-to-noise ratio, and more ultra-thin packages.

With the release of new communication standards (i.e., $5^{th}$ generation mobile networks), there is a need to maintain a high electromechanical coupling coefficient and a high Q value while extending an operating range of resonators to higher frequencies.

SUMMARY

Based on this, there is a need to provide a method for fabricating a laterally excited shear mode acoustic resonator, which can have a high electromechanical coupling coefficient and a high Q value at frequencies above 3 GHz.

A method for fabricating a laterally excited shear mode acoustic resonator includes: providing a piezoelectric layer including monocrystalline lithium niobate and/or monocrystalline lithium tantalate, the piezoelectric layer having a first surface and a second surface opposite to each other; forming an acoustic mirror on the first surface; the acoustic mirror including at least one first acoustic reflection layer and at least one second acoustic reflection layer, the first acoustic reflection layers and the second acoustic reflection layers being alternately superimposed and one first acoustic reflection layer being closest to the piezoelectric layer, and acoustic impedance of each of the first acoustic reflection layers being less than that of each of the second acoustic reflection layers; bonding a bearing wafer on a first surface of the acoustic mirror, the first surface of the acoustic mirror being a side facing away from the piezoelectric layer; and forming an electrode unit and a lateral reflector on the second surface; the electrode unit being used for forming an electric field, the lateral reflector including a first reflector located on a first side of the electrode unit and a second reflector located on a second side of the electrode unit, the first side and the second side being opposite sides, and the lateral reflector being used for laterally reflecting a sound wave.

In an embodiment, the step of forming an acoustic minor on the first surface includes forming three first acoustic reflection layers and two second acoustic reflection layers.

In an embodiment, the first acoustic reflection layer farther away from the piezoelectric layer has a thicker thickness; and the second acoustic reflection layer farther away from the piezoelectric layer has a thicker thickness.

In an embodiment, the step of forming an electrode unit and a lateral reflector on the second surface includes: depositing and etching a first metal layer to form the electrode unit and the lateral reflector; the electrode unit comprising a first common electrode, a second common electrode, a plurality of first interdigitated electrodes, and a plurality of second interdigitated electrodes, the first interdigitated electrodes being electrically connected to the first common electrode, the plurality of second interdigitated electrodes being electrically connected to the second common electrode, the plurality of first interdigitated electrodes being insulated from the plurality of second interdigitated electrodes, the first common electrode being used for connecting an input voltage, and the second common electrode being used for grounding.

In an embodiment, the electrode unit is used for forming an electric field mainly parallel to the piezoelectric layer and for generating a mechanical wave in a shear mode across an entire thickness of the piezoelectric layer.

In an embodiment, the step of forming an electrode unit and a lateral reflector on the second surface further includes: depositing and etching a second metal layer on the electrode unit to form a first metal part on the first common electrode and a second metal part on the second common electrode, thicknesses of the first metal part and the second metal part being greater than that of the electrode unit, the first metal part and the second metal part being used for performing acoustic reflection in a first direction, and the first direction being perpendicular to a propagation direction of the sound wave.

In an embodiment, a direction of a connection line between lateral reflectors on two sides of the electrode unit is the propagation direction of the sound wave; the first acoustic reflection layers and the second acoustic reflection layers of the acoustic mirror are aligned on two side edges in the first direction, and the first direction is perpendicular to the direction of the connection line on a plane that is perpendicular to a height direction of the resonator; a first end of each of the first interdigitated electrodes is connected to the first common electrode, a first end of each of the second interdigitated electrodes is connected to the second common electrode, an orthographic projection of an edge of the first end of each of the first interdigitated electrodes on the acoustic mirror is aligned with a first side edge of the acoustic mirror in the first direction, and an orthographic projection of an edge of each of the first ends of the second interdigitated electrodes on the acoustic mirror are aligned with a second side edge of the acoustic mirror in the first direction.

In an embodiment, both the first reflector and the second reflector include at least one electrode strip, a distance between a center of the electrode strip in the first reflector closest to the electrode unit and the center of the interdigitated electrode on a first side edge of the electrode unit is ⅛ to 2 wavelengths of the sound wave, and a distance between a center of the electrode strip in the second reflector closest to the electrode unit and the center of the interdigitated electrode on a second side edge of the electrode unit is ⅛ to 2 wavelengths of the sound wave.

In an embodiment, before the step of bonding a bearing wafer on a first surface of the acoustic mirror, the method includes: polishing the first surface of the acoustic mirror; and depositing a bonding auxiliary layer on the first surface of the acoustic mirror or a bonding surface of the bearing wafer.

In an embodiment, the bonding auxiliary layer is a silicon oxide layer.

In an embodiment, the step of forming an acoustic mirror on the first surface includes: depositing and etching the acoustic minor, and depositing a filling layer on the piezoelectric layer, to fill a position where the acoustic mirror is etched away.

In an embodiment, the step of depositing and etching the acoustic mirror, and depositing a filling layer on the piezoelectric layer includes: step A, depositing the first acoustic reflection layer; step B, depositing the second acoustic reflection layer on the first acoustic reflection layer; step C, etching the second acoustic reflection layer; step D, depositing the filling layer; and sequentially repeating step A, step B, step C, and step D till a required number of first acoustic reflection layers and second acoustic reflection layers are formed.

In an embodiment, the step of depositing and etching the acoustic mirror, and depositing a filling layer on the piezoelectric layer includes: step A, depositing the first acoustic reflection layer; step B, depositing the second acoustic reflection layer on the first acoustic reflection layer; step C, etching the second acoustic reflection layer; and sequentially repeating step A, step B, and step C till a required number of first acoustic reflection layers and second acoustic reflection layers are formed, and then depositing the filling layer.

In an embodiment, the filling layer is made of the same material as the first acoustic reflection layer.

In an embodiment, a material of each first acoustic reflection layer includes at least one selected from a group consisting of silicon dioxide, aluminum, benzocyclobutene, polyimide, and spin on glass, and a material of each second acoustic reflection layer includes at least one selected from a group consisting of molybdenum, tungsten, titanium, platinum, aluminum nitride, tungsten oxide, and silicon nitride.

In an embodiment, the electrode unit is made of the same material as the lateral reflector and is made of metal and/or an alloy.

In the method for fabricating the laterally excited shear mode acoustic resonator, the piezoelectric layer using monocrystalline lithium niobate or monocrystalline lithium tantalate is integrated into a proprietary microfabrication process flow, and the formed resonator generates an electric field by using the electrode unit and laterally reflects a sound wave by using the lateral reflector, so that it can be excited into a lateral shear vibration mode and has a high electromechanical coupling coefficient and a high Q value at frequencies above 3 GHz.

BRIEF DESCRIPTION OF THE DRAWINGS

In order to more clearly illustrate the technical solutions in the embodiments of the present disclosure or in the related art, the accompanying drawings needing to be used in the description of the embodiments or the related art will be briefly introduced below. It is appreciated that, the accompanying drawings in the following description are only some embodiments of the present disclosure, and other drawings can be obtained by those of ordinary skill in the art from the provided drawings without creative work.

DETAILED DESCRIPTION OF THE EMBODIMENTS

To facilitate understanding of the present disclosure, a more comprehensive description of the present disclosure will be given below with reference to the relevant drawings. Embodiments of the present disclosure are given in the drawings. However, the present disclosure may be implemented in many different forms but is not limited to the embodiments described herein. Rather, these embodiments are provided to make the contents disclosed in the present disclosure more fully understood.

Unless defined otherwise, all technical and scientific terms used herein have the same meanings as are commonly understood by those skilled in the art. The terms used herein in the specification of the present disclosure are for the purpose of describing specific embodiments only but not intended to limit the present disclosure.

It should be understood that when an element or layer is referred to as being "on", "adjacent to", "connected to", or "coupled to" another element or layer, the element or layer may be directly on, adjacent to, connected to, or coupled to the another element or layer, or an intervening element or layer may be disposed therebetween. On the contrary, when an element is referred to as being "directly on", "directly adjacent to", "directly connected to", or "directly coupled to" another element or layer, no intervening element or layer may be disposed therebetween. It should be understood that although terms such as first, second, and third may be used to describe various elements, components, regions, layers, doping types and/or portions, the elements, components, regions, layers, doping types and/or portions may not be limited to such terms. Such terms are used only to distinguish one element, component, region, layer, doping type, or portion from another element, component, region, layer, doping type, or portion. Thus, without departing from the teaching of the present disclosure, a first element, component, region, layer, doping type, or portion may be referred to as a second element, component, region, layer, doping type, or portion. For example, a first doping type may be referred to as a second doping type, and similarly, the second doping type may be referred to as the first doping type. The first doping type and the second doping type are different doping types. For example, the first doping type may be P-type and the second doping type may be N-type, or the first doping type may be N-type and the second doping type may be P-type.

Spatial relationship terms such as "under", "underneath", "below", "beneath", "over", and "above" may be used for illustrative purposes to describe a relationship between one element or feature and another element or feature illustrated in the figures. It should be understood that, in addition to the orientations illustrated in the figures, the spatial relationship terms are intended to further include different orientations of the device in use and operation. For example, if the device in the figures is flipped, the element or feature described as "below", "underneath" or "under" another element or feature may be oriented as "on" the another element or feature. Thus, the exemplary terms "below" and "under" may include two orientations of above and below in addition, the device may include additional orientations (e.g., 90-degree rotation or other orientations), and, thus spatial descriptors used herein may be interpreted accordingly.

When using in the present disclosure, the singular forms of "a/an", "an", and "the" may also include plural forms, unless otherwise clearly specified by the context. It should be further understood that the terms "include/comprise" and/or "have" specify the presence of the features, integers, steps, operations, components, portions, or their combinations, but may not exclude the presence or addition of one or more of other features, integers, steps, operations, components, portions, or their combinations. At the same time, in the specification, the term "and/or" may include any and all combinations of related listed items.

Various embodiments of the present disclosure are described herein with reference to cross-sectional views of schematic diagrams of ideal embodiments (and intermediate structures) of the present disclosure. Correspondingly, illustrated shape variations caused by, for example, manufacturing techniques and/or tolerances, may be expected. Thus, the embodiments of the present disclosure may not be limited to the specific shapes of the regions illustrated herein, but may include shape deviations caused by, for example, the manufacturing techniques. For example, an implanted region illustrated as a rectangle, typically, has rounded or curved features and/or a gradient of implant concentration at its edges rather than a binary change from an implanted region to a non-implanted region. Likewise, a buried region formed by implantation may result in some implantation in the region between the buried region and a surface through which the implantation takes place. Thus, the region shown in the figure is generally schematic, and the illustrated shape is not intended to show the actual shape of the region of the device, and is not intended to limit the scope of the present disclosure.

Bulk acoustic wave (BAW) and surface acoustic wave (SAW) resonators are most commonly used devices for synthesizing filters and oscillators between 0.6 GHz and 3 GHz. These acoustic devices are commercially successful and are widely used in mobile phone front-end modules or as discrete elements for radio front-ends. Existing BAW and SAW devices can exhibit Q values in excess of 1000 and electromechanical coupling coefficients of approximately 7%-10% at frequencies below 3 GHz. However, extension of its frequency operating range to be above 3 GHz may be subject to several technical uncertainties and fundamental limitations. A new 5G standard requires an electromechanical coupling factor to be more than 10%. This requirement cannot be achieved by BAW and SAW devices without changing constitutive materials or operation modes. Similarly, material losses pose a fundamental limit on an achievable maximum Q value of existing BAW and SAW devices above 3 GHz.

Based on the above, the market needs new devices with high electromechanical coupling and a high-quality factor at frequencies above 3 GHz.

The present disclosure is intended to develop a new mechanical/acoustic wafer-level resonator and to provide a method for fabricating the same. The resonator can have a high Q value and a high electromechanical coupling coefficient at frequencies above 3 GHz. The resonator supports the synthesis of high-performance passband filters, thereby meeting new requirements of the 5G communication standard and future updates.

Figure 1:
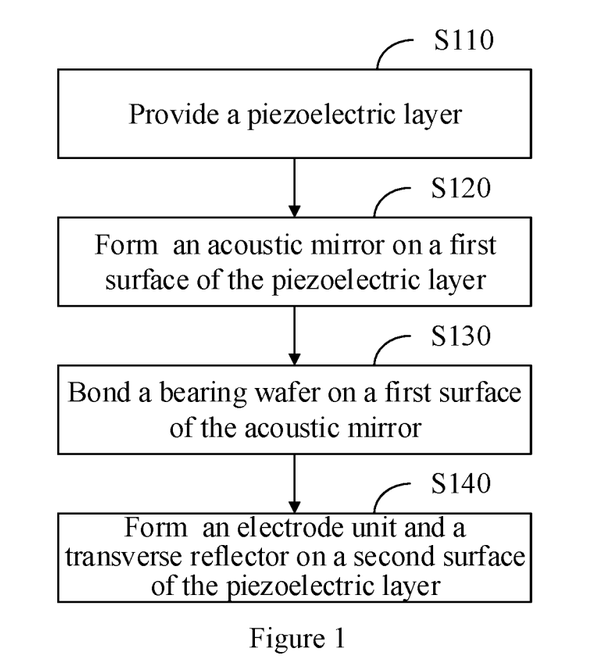
FIG. 1 is a flowchart of a method for fabricating a laterally excited shear mode acoustic resonator according to an embodiment.

FIG. 1 is a flowchart of a method for fabricating a laterally excited shear mode acoustic resonator according to an embodiment. The method includes the following steps.

In S110, a piezoelectric layer is provided.

The piezoelectric layer includes monocrystalline lithium niobate and/or monocrystalline lithium tantalate. The piezoelectric layer has a first surface and a second surface opposite to each other.

In S120, an acoustic mirror is formed on the first surface of the piezoelectric layer.

Figure 2:
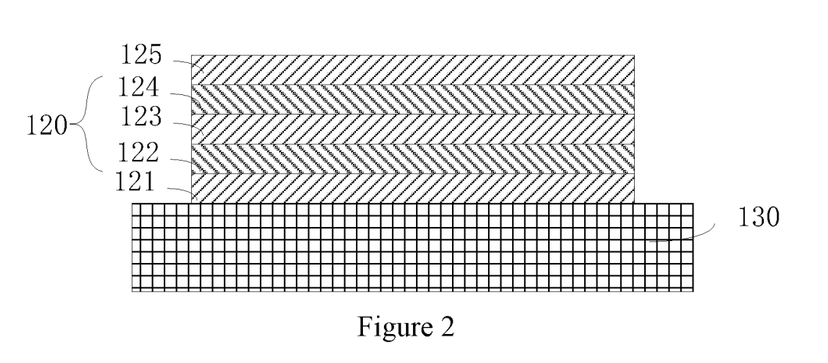
FIG. 2 is a schematic cross-sectional diagram of a device after completion of step S120 according to an embodiment.

The formed acoustic mirror includes at least one first acoustic reflection layer and at least one second acoustic reflection layer. The first acoustic reflection layers and the second acoustic reflection layers are alternately superimposed and the layer that is closest to the piezoelectric layer is a first acoustic reflection layer (i.e., there is a first acoustic reflection layer that is closer to the piezoelectric layer than all the second acoustic reflection layers). Acoustic impedance of each of the first acoustic reflection layers is less than that of each of the second acoustic reflection layers. FIG. 2 is a schematic cross-sectional diagram of a device after completion of step S120 according to an embodiment. In the embodiment, an acoustic mirror 120 includes three first acoustic reflection layers (i.e., a first acoustic reflection layer 121, a first acoustic reflection layer 123, and a first acoustic reflection layer 125) and two second acoustic reflection layer (i.e., a second acoustic reflection layer 122 and a second acoustic reflection layer 124).

In an embodiment of the present disclosure, step S120 includes: depositing and etching the acoustic mirror, and depositing a filling layer on the piezoelectric layer, to fill a position where the acoustic mirror is etched away. Depositing the filling layer can improve the flatness of the acoustic resonator.

In S130, a bearing wafer is bonded on a first surface of the acoustic mirror.

The first surface of the acoustic mirror is a side facing away from the piezoelectric layer. Before the bearing wafer is bonded, the first surface of the acoustic mirror may be polished, so as to provide a flat interface for bonding. In an embodiment of the present disclosure, polishing can be carried out using a chemical mechanical polishing (CMP) process.

In an embodiment of the present disclosure, the bearing wafer may be made of silicon, sapphire, quartz, or other materials.

Figure 3:
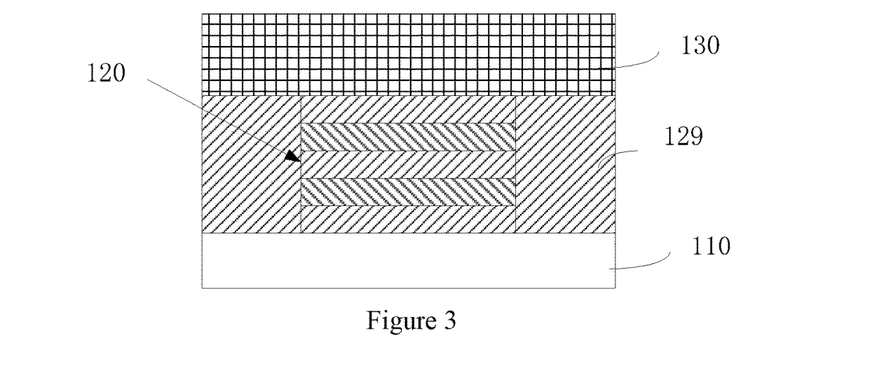
FIG. 3 is a schematic cross-sectional diagram of a device after a bearing wafer 110 is bonded according to an embodiment.

FIG. 3 is a schematic cross-sectional diagram of a device after a bearing wafer 110 is bonded according to an embodiment. In the embodiment, all the first acoustic reflection layers and second acoustic reflection layers of the acoustic mirror 120 are deposited and then etched together, so that all film layers of the acoustic mirror 120 are patterned and made to have similar lateral dimensions. The acoustic mirror 120 is etched and then the filling layer 129 is deposited. In an embodiment of the present disclosure, the filling layer 129 may be made of the same material as the first acoustic reflection layers, which is advantageous for improving the quality factor of the acoustic resonator. In other embodiments, the filling layer 129 may also be made of other materials that are process-compatible (i.e., the materials do not react with other film layer structures of the acoustic resonator, resulting in changes in properties of the other film structures) and can be planarized.

In S140, an electrode unit and a lateral reflector are formed on the second surface of the piezoelectric layer.

The lateral reflector includes a first reflector located on a first side of the electrode unit and a second reflector located on a second side of the electrode unit. The first side and the second side are opposite sides. The electrode unit is used for forming an electric field, and the lateral reflector is used for laterally reflecting a sound wave.

In the method for fabricating an acoustic resonator in a lateral excitation shear mode, the piezoelectric layer using monocrystalline lithium niobate or monocrystalline lithium tantalate is integrated into a proprietary microfabrication process flow, and the formed resonator generates an electric field by using the electrode unit and laterally reflects a sound wave by using the lateral reflector, so that it can be excited into a lateral shear vibration mode and has a high electromechanical coupling coefficient and a high Q value at frequencies above 3 GHz.

In an embodiment of the present disclosure, before step S140, the method further includes a step of thinning the piezoelectric layer to a desired thickness. The thinning may be carried out by grinding and polishing. In an embodiment of the present disclosure, the thickness of the piezoelectric layer after thinning is less than 1 micron. In an embodiment of the present disclosure, the step of thinning the piezoelectric layer is carried out after step S130.

Figure 4:
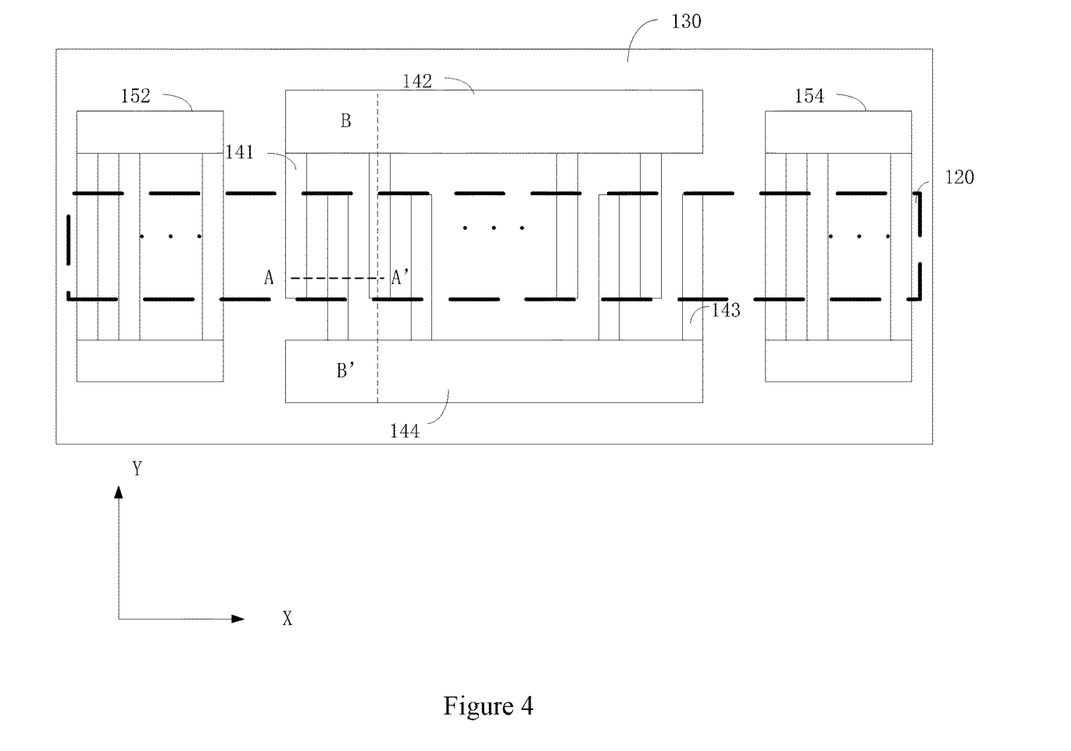
FIG. 4 is a top view of a partial structure of a laterally excited shear mode acoustic resonator according to an embodiment.
Figure 5:
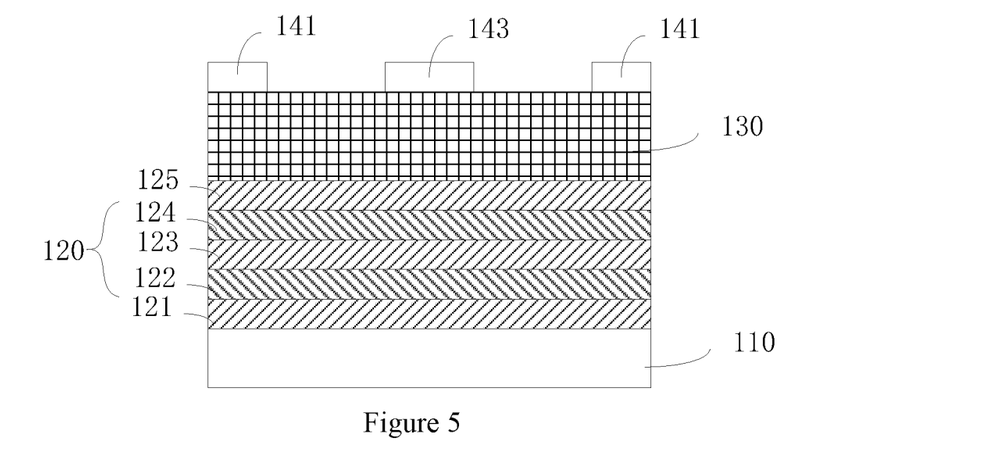
FIG. 5 is a cross-sectional view along an A-A' line in FIG. 4.

In an embodiment of the present disclosure, in step S140, the electrode unit and the lateral reflector are formed by depositing and etching a first metal layer. FIG. 4 is a top view of a partial structure of the laterally excited shear mode acoustic resonator according to an embodiment. FIG. 5 is a cross-sectional view along an A-A' line in FIG. 4. Referring to FIG. 4 and FIG. 5, in the embodiment, the laterally excited shear mode acoustic resonator fabricated by the method for fabricating an laterally excited shear mode acoustic resonator includes the acoustic mirror 120, the piezoelectric layer 130, the electrode unit, and the lateral reflector. FIG. 4 is mainly intended to illustrate shapes of the electrode unit and the lateral reflector in the corresponding embodiment, so other structures on the piezoelectric layer 130 are omitted.

The electrode unit is disposed on the piezoelectric layer 130 and is used for forming an electric field. The electrode unit may include interdigitated electrodes. In the embodiment shown in FIG. 4 and FIG. 5, the electrode unit includes a set of first interdigitated electrodes 141 and a set of second interdigitated electrodes 143. The first interdigitated electrodes 141 and the second interdigitated electrodes 143 extend toward a first direction (the Y direction in FIG. 1), and thus are parallel to each other. The first interdigitated electrodes 141 are insulated from the second interdigitated electrodes 143. The first interdigitated electrodes 141 are used for connecting an input voltage, and the second interdigitated electrodes 143 are used for grounding. The electrode unit further includes a first common electrode 142 and a second common electrode 144. One end of each of the first interdigitated electrodes 141 is connected to the first common electrode 142, and one end of each of the second interdigitated electrodes 143 are connected to the second common electrode 144. The common electrode is also referred to as a busbar.

The lateral reflector is also disposed on the piezoelectric layer 130, may be arranged in the same layer as the electrode unit, and includes a first reflector 152 on a first side (the left side in FIG. 4) of the electrode unit and a second reflector 154 on a second side (the right side in FIG. 4) of the electrode unit. The lateral reflector is insulated from the electrode unit, and is used for laterally reflecting the sound wave.

The piezoelectric layer 130 is disposed on the acoustic mirror 120. The piezoelectric layer 130 includes monocrystalline lithium niobate and/or monocrystalline lithium tantalate.

Figure 6:
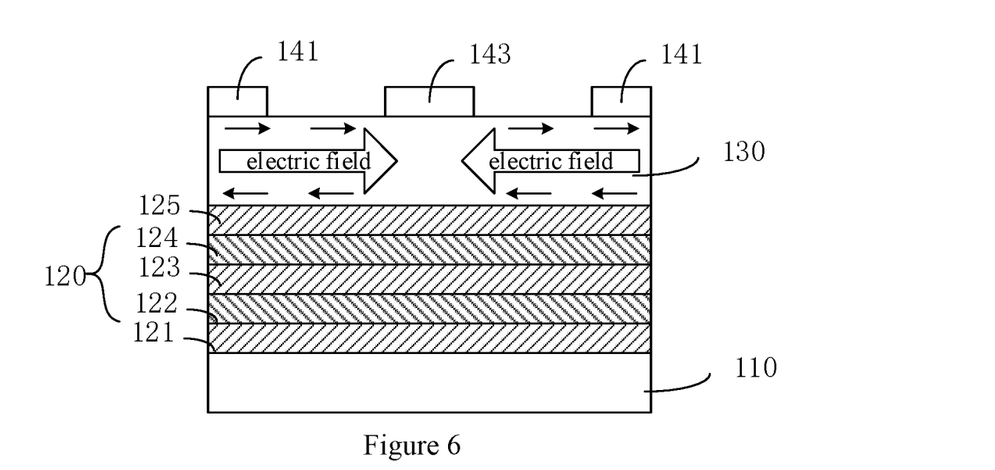
FIG. 6 is a schematic diagram of an electric field and a propagation direction of a mechanical wave in a piezoelectric layer.

Referring to FIG. 6, the large arrow in the figure indicates a direction of an electric field, while the small arrow indicates a propagation direction of a mechanical wave in a shear vibration mode. The electric field is mainly parallel to the piezoelectric layer 130 and is used for generating a mechanical wave in a shear mode across an entire thickness of the piezoelectric layer 130. The monocrystalline lithium niobate/monocrystalline lithium tantalate combined with the structure of the electrode unit and the structure of the lateral reflector of the present disclosure can obtain an optimal shear vibration mode. This shear vibration mode has a greater acoustic wave velocity and can achieve a higher frequency than conventional commercial filters without changing key dimensions (such as a step pitch of the interdigitated electrode) of the device.

In an embodiment of the present disclosure, the electrode unit is made of the same material as the lateral reflector and is made of metal and/or an alloy. In an embodiment of the present disclosure, the electrode unit may be made of aluminum (Al), copper (Cu), aluminum copper (AlCu), aluminum silicon copper (AlSiCu), molybdenum (Mo), tungsten (W), silver (Ag), or any other conductive metal.

In the embodiment shown in FIG. 5, the alaterally excited shear mode acoustic resonator further includes the beating wafer 110. The acoustic mirror 120 is disposed on the bearing wafer 110.

In an embodiment of the present disclosure, after the step of polishing the first surface of the acoustic mirror and before the step of bonding a bearing wafer, the method further includes a step of depositing a bonding auxiliary layer on the first surface of the acoustic mirror or a bonding surface of the hearing wafer. In an embodiment of the present disclosure, the bonding auxiliary layer may be a thin silicon dioxide layer.

In an embodiment of the present disclosure, the first acoustic reflection layers are made of a low-acoustic-impedance material, and the second acoustic reflection layers are made of a high-acoustic-impedance material. The low-acoustic-impedance material may be at least one of silicon dioxide, aluminum, Benzocyclobutene (BCB), polyimide, and spin on glass. The high-acoustic-impedance material may be at least one of molybdenum, tungsten, titanium, platinum, aluminum nitride, alumina, tungsten oxide, and silicon nitride. It may be understood that, in other embodiments, the low-acoustic-impedance material and the high-acoustic-impedance material may also be combinations of other materials with large impedance ratios.

Figure 7:
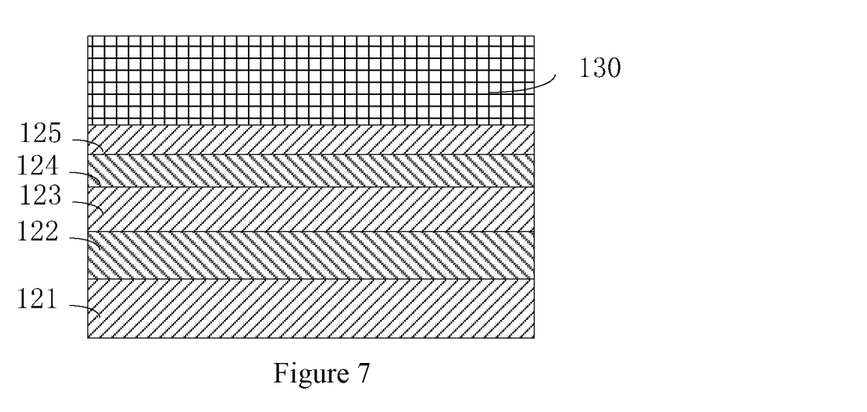
FIG. 7 is a schematic diagram of thickness of various reflection layers of a reflecting mirror according to an embodiment.

The first acoustic reflection layers and the second acoustic reflection layers of the acoustic mirror 120 may have equal or unequal thicknesses. In an embodiment of the present disclosure, the first acoustic reflection layer farther away from the piezoelectric layer 130 has a thicker thickness; and the second acoustic reflection layer farther away from the piezoelectric layer 130 has a thicker thickness. This design allows for a larger Q value. Referring to FIG. 7, in the embodiment shown in FIG. 7, a thickness Tl1 of the first acoustic reflection layer 121<a thickness Tl2 of the first acoustic reflection layer 123<a thickness Tl3 of the first acoustic reflection layer 125, and a thickness Th1 of the second acoustic reflection layer 122<a thickness Th2 of the second acoustic reflection layer 124. It may be understood that, in other embodiments, a thickness relationship between the first acoustic reflection layers and the second acoustic reflection layers may also be set according to other laws, such as Tl1=Tl2=Tl3 and Th1=Th2; or Tl1>Tl2>Tl3 and Th1>Th2; or Tl1<Tl2, Tl3<Tl2, and Th1<Th2.

FIG. 4 also shows a position of the acoustic mirror 120 in an overhead view. The X direction in FIG. 4 is the propagation direction of the sound wave. The first acoustic reflection layers and the second acoustic reflection layers of the acoustic mirror 120 are aligned on two side edges in the Y direction. An orthographic projection of an edge of one end of each of the first interdigitated electrodes 141 away from the first common electrode 142 on the acoustic mirror 120 is aligned with a first side edge of the acoustic mirror 120 in the Y direction, and an orthographic projection of an edges of one end of each of the second interdigitated electrodes 143 away from the first common electrode 142 on the acoustic mirror 120 is aligned with a second side edge of the acoustic mirror 120 in the Y direction.

Figure 8:
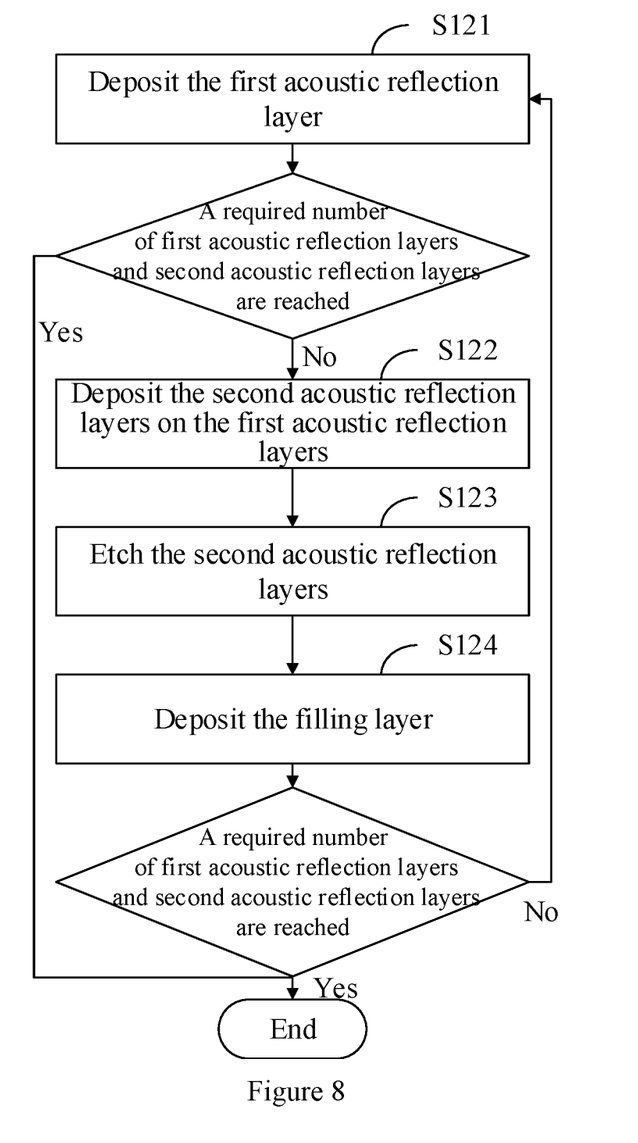
FIG. 8 is a flowchart of sub-steps of step S120 according to an embodiment.

Referring to FIG. 8, in an embodiment of the present disclosure, the step of depositing and etching the acoustic mirror, and depositing a filling layer on the piezoelectric layer, to fill a position where the acoustic mirror is etched away specifically includes the following steps.

In S121, the first acoustic reflection layer is deposited.

The first acoustic reflection layer 121 is deposited on a surface of the piezoelectric layer 130. After deposition, a surface of the first acoustic reflection layer 121 may be polished.

In S122, the second acoustic reflection layer is deposited on the first acoustic reflection layer.

The second acoustic reflection layer 122 is deposited on the first acoustic reflection layer 121.

In S123, the second acoustic reflection layer is etched.

The second acoustic reflection layer 122 is etched separately (the first acoustic reflection layer 121 is not etched).

In S124, the filling layer is deposited.

The filling layer 129 is deposited on the first acoustic reflection layer 121. After deposition, the excess thickness of the filling layer 129 may be etched away and/or surfaces of the filling layer 129 and the second acoustic reflection layer 122 may be polished. The filling layer 129 may be made of the same material as the first acoustic reflection layers or made of other materials that are compatible with the process flow and can be planarized.

Figure 10A:
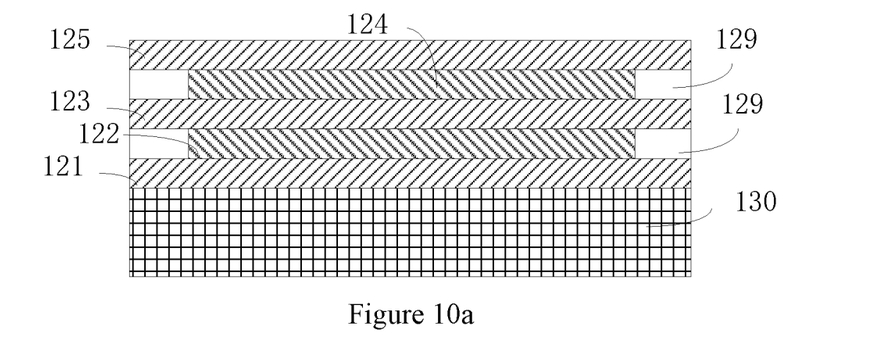
FIG. 10a to FIG. 10c are schematic structural diagrams of an acoustic mirror according to three different embodiments.

Upon completion of step S124, the method goes back to step S121, that is, the first acoustic reflection layer 123 is continuously deposited on the second acoustic reflection layer 122 and the filling layer 129. Then, steps S122, S123, S124, S121, . . . are performed sequentially till a required number of first acoustic reflection layers and second acoustic reflection layers are formed, as shown in FIG. 10a.

Figure 10B:
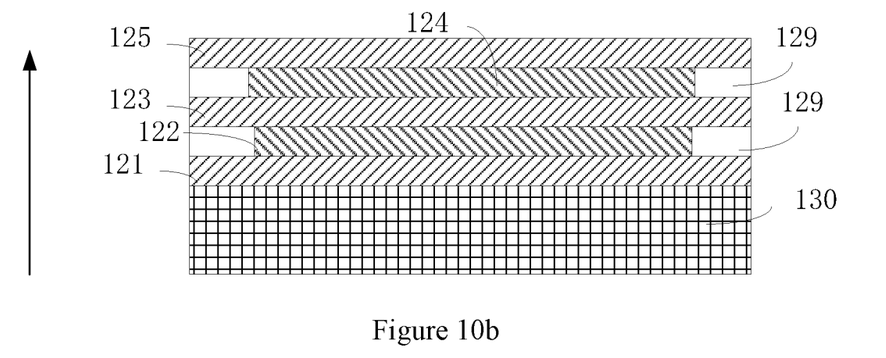

In an embodiment of the present disclosure, in a direction from the piezoelectric layer 130 to the bearing wafer 110 (that is, the direction indicated by the arrow in FIG. 10b), areas of different second acoustic reflection layers gradually increase, so that a downward projection of a lateral dimension of each second acoustic reflection layer covers the second acoustic reflection layers therebelow.

Figure 10C:
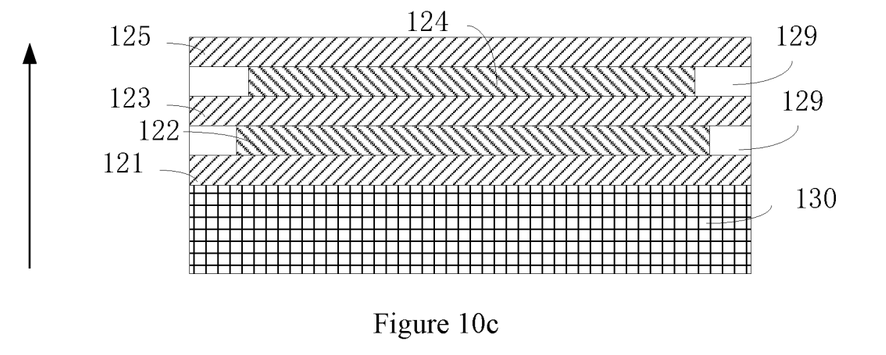

In another embodiment of the present disclosure, in a direction from the piezoelectric layer 130 to the bearing wafer 110 (that is, the direction indicated by the arrow in FIG. 10c), areas of different second acoustic reflection layers gradually decrease, so that an upward projection of a lateral dimension of each second acoustic reflection layer covers the second acoustic reflection layers thereabove.

Figure 9:
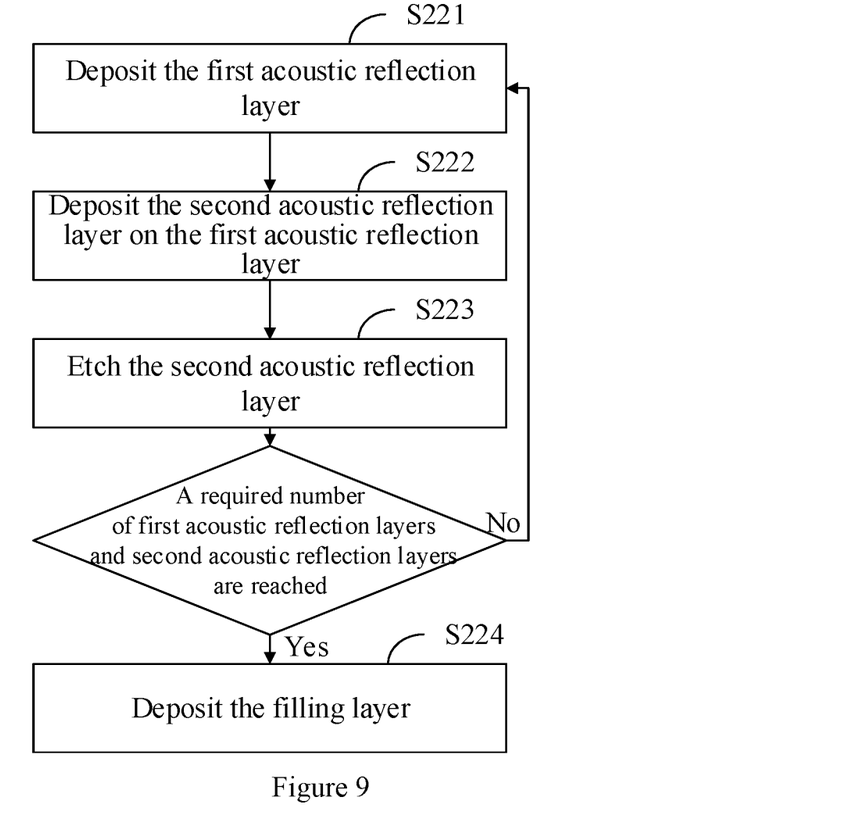
FIG. 9 is a flowchart of sub-steps of step S120 according to another embodiment.

Referring to FIG. 9, in another embodiment of the present disclosure, the step of depositing and etching the acoustic mirror, and depositing a filling layer on the piezoelectric layer, to fill a position where the acoustic mirror is etched away specifically includes:

In S221, the first acoustic reflection layer is deposited.

The first acoustic reflection layer 121 is deposited on a surface of the piezoelectric layer 130. After deposition, a surface of the first acoustic reflection layer 121 may be polished.

In S222, the second acoustic reflection layer is deposited on the first acoustic reflection layer.

The second acoustic reflection layer 122 is deposited on the first acoustic reflection layer 121.

In S223, the second acoustic reflection layer is etched.

The second acoustic reflection layer 122 is etched separately (the first acoustic reflection layer 121 is not etched). After etching, a surface of the second acoustic reflection layer 122 may be polished.

Figure 11:
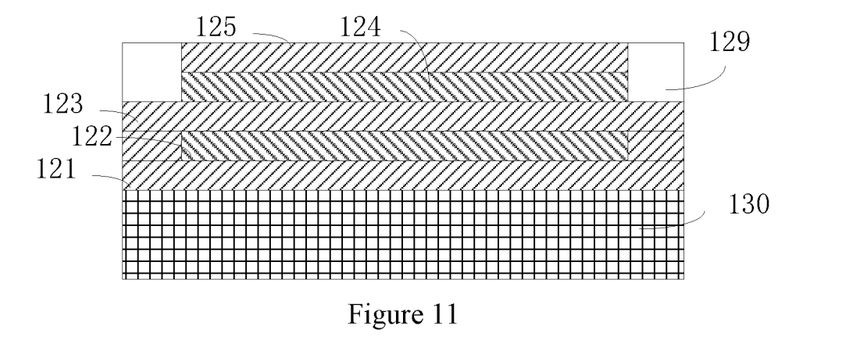
FIG. 11 is a schematic structural diagram of an acoustic mirror formed with the method shown in FIG. 9 according to an embodiment.

The method goes back to step S221 after step S223, that is, the first acoustic reflection layer 123 is deposited on the second acoustic reflection layer 122, and the material of the first acoustic reflection layer 123 may be filled at a position where the second acoustic reflection layer 122 is etched away. Then, steps S222, S223, S221, . . . are performed sequentially till a required number of first acoustic reflection layers and second acoustic reflection layers are formed, and then step S224 is performed: the filling layer is deposited on the topmost first acoustic reflection layer/second acoustic reflection layer (that is, the first acoustic reflection layer/second acoustic reflection layer closest to the bearing wafer). A device structure formed by the embodiment shown in FIG. 9 can be referred to FIG. 11.

In an embodiment of the present disclosure, the material of the filling layer formed on the topmost layer may cover the first acoustic reflection layer/second acoustic reflection layer without removal, but the surface of the filling layer should be guaranteed to be flat (which can be achieved by polishing and other planarization means).

Figure 12:
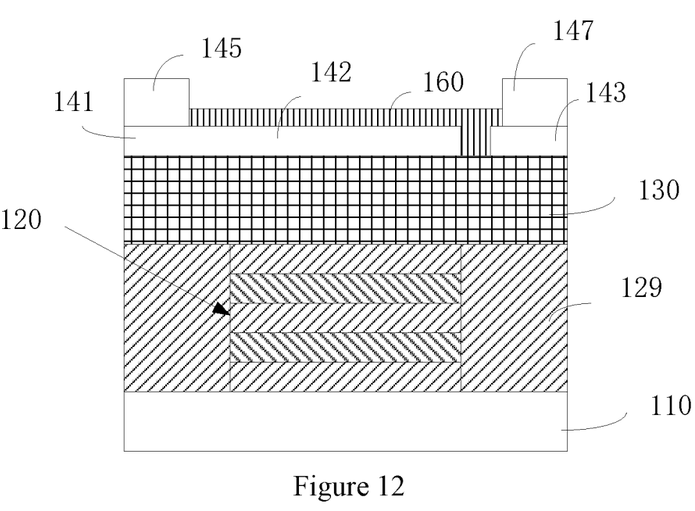
FIG. 12 is a cross-sectional view along a B-B' line in FIG. 4.

In an embodiment of the present disclosure, after the electrode unit and the lateral reflector are formed in step S140, the method further includes a step of depositing and etching a second metal layer on the electrode unit to form a first metal part on the first common electrode and a second metal part on the second common electrode FIG. 12 is a cross-sectional view along a B-B' line in FIG. 4. Thicknesses of the first metal part 145 and the second metal part 147 are greater than that of the electrode unit. The first metal part 145 and the second metal part 147 are used for carrying out acoustic reflection in the Y direction in FIG. 1. The first metal part 145 and the second metal part 147 may also be used for directing an electrical signal from the resonator to a pad.

In an embodiment of the present disclosure, after the second mental part is formed, the method further includes a step of forming a passivation layer on the piezoelectric layer. In the embodiment shown in FIG. 12, the passivation layer 160 is disposed on the piezoelectric layer 130 and covers the first interdigitated electrodes 141 and the second interdigitated electrodes 143. The passivation layer 160 can reduce a frequency temperature coefficient of the resonator and passivate a metal electrode. In an embodiment of the present disclosure, the passivation layer 160 may be made of silicon dioxide or silicon nitride.

A vibration frequency of the mechanical wave in the shear vibration mode formed in the piezoelectric layer 130 is related to a thickness of each film and a distance between adjacent interdigitated electrodes in the electrode unit. The stress is mainly confined to a region between the first interdigitated electrode 141 and the second interdigitated electrode 143 and not covered by metal.

Figure 13:
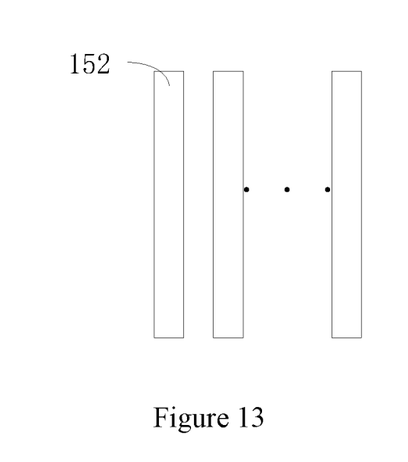
FIG. 13 is a schematic structural diagram of a first reflector according to an embodiment.

As shown in FIG. 13, electrode strips of the lateral reflector may be disconnected from each other or connected by a lateral structure as shown in FIG. 4. The electrode strips of the lateral reflector may be arranged parallel to the interdigitated electrodes of the electrode unit.

It should be understood that, although the steps in the flowcharts in FIGS. 1, 8, and 9 are sequentially displayed as indicated by arrows, the steps are not necessarily performed in the order indicated by the arrows. Unless otherwise expressly stated herein, the order of performing the steps is not strictly limited, and the steps may be performed in other orders. Moreover, at least some of the steps in FIGS. 1, 8, and 9 may include a plurality of steps or a plurality of stages. The steps or stages are not necessarily performed at the same time, but may be performed at different times. The steps or stages are not necessarily sequentially performed, but may be performed together with other steps or with at least a part of steps or stages of other steps in turn or alternately.

In the description of the specification, reference terms such as "some embodiments", "other embodiments", and "ideal examples" mean that a particular feature, structure, material, or characteristic described in connection with the embodiment or example is included in at least one embodiment or example of the present disclosure. In the specification, the schematic expressions to the above terms are not necessarily referring to the same embodiment or example.

Technical features of the above embodiments may be combined randomly. To make descriptions brief, not all possible combinations of the technical features in the embodiments are described. Therefore, as long as there is no contradiction between the combinations of the technical features, they should all be considered as scopes disclosed in the specification.

The above embodiments only describe several implementations of the present disclosure, and their description is specific and detailed, but cannot therefore be understood as a limitation on the patent scope of the present disclosure. It should be noted that those of ordinary skill in the art may further make variations and improvements without departing from the conception of the present disclosure, and these all fall within the protection scope of the present disclosure. Therefore, the patent protection scope of the present disclosure should be subject to the appended claims.

What is claimed is:

1. A method for fabricating a laterally excited shear mode acoustic resonator, comprising:
    providing a piezoelectric layer comprising monocrystalline lithium niobate and/or monocrystalline lithium tantalate, the piezoelectric layer having a first surface and a second surface opposite to each other;
    forming an acoustic mirror on the first surface; the acoustic mirror comprising at least one first acoustic reflection layer and at least one second acoustic reflection layer, the first acoustic reflection layers and the second acoustic reflection layers being alternately superimposed and one first acoustic reflection layer being closest to the piezoelectric layer, and acoustic impedance of each of the first acoustic reflection layers being less than that of each of the second acoustic reflection layers;
    bonding a bearing wafer on a first surface of the acoustic mirror, the first surface of the acoustic mirror being a side facing away from the piezoelectric layer; and
    forming an electrode unit and a lateral reflector on the second surface; the electrode unit being used for forming an electric field, the lateral reflector comprising a first reflector located on a first side of the electrode unit and a second reflector located on a second side of the electrode unit, the first side and the second side being opposite sides, and the lateral reflector being used for laterally reflecting a sound wave;
    wherein the step of forming an acoustic mirror on the first surface comprises:
        depositing and etching the acoustic mirror, and depositing a filling layer on the piezoelectric layer, to fill a position where the acoustic mirror is etched away; and
    wherein the step of depositing and etching the acoustic mirror, and depositing a filling layer on the piezoelectric layer comprises:
        step A, depositing the first acoustic reflection layer;
        step B, depositing the second acoustic reflection layer on the first acoustic reflection layer;
        step C, etching the second acoustic reflection layer;
        step D, depositing the filling layer; and
        sequentially repeating step A, step B, step C, and step D till a required number of first acoustic reflection layers and second acoustic reflection layers are formed.

2. The method for fabricating a laterally excited shear mode acoustic resonator according to claim 1, wherein the step of forming an acoustic mirror on the first surface comprises forming three first acoustic reflection layers and two second acoustic reflection layers.

3. The method for fabricating a laterally excited shear mode acoustic resonator according to claim 1, wherein the step of forming an electrode unit and a lateral reflector on the second surface comprises:
    depositing and etching a first metal layer to form the electrode unit and the lateral reflector; the electrode unit comprising a first common electrode, a second common electrode, a plurality of first interdigitated electrodes, and a plurality of second interdigitated electrodes, the first interdigitated electrodes being electrically connected to the first common electrode, the plurality of second interdigitated electrodes being electrically connected to the second common electrode, the plurality of first interdigitated electrodes being isolated from the plurality of second interdigitated electrodes, the first common electrode being used for connecting an input voltage, and the second common electrode being used for grounding; and depositing and etching a second metal layer on the electrode unit to form a first metal part on the first common electrode and a second metal part on the second common electrode, thicknesses of the first metal part and the second metal part being greater than that of the electrode unit, the first metal part and the second metal part being used for performing acoustic reflection in a first direction, and the first direction being perpendicular to a propagation direction of the sound wave.

4. The method for fabricating a laterally excited shear mode acoustic resonator according to claim 1, wherein before the step of bonding a bearing wafer on a first surface of the acoustic mirror, the method comprises:

polishing the first surface of the acoustic mirror; and depositing a bonding auxiliary layer on the first surface of the acoustic mirror or a bonding surface of the bearing wafer.

5. The method for fabricating a laterally excited shear mode acoustic resonator according to claim 4, wherein the bonding auxiliary layer is a silicon oxide layer.

6. A method for fabricating a laterally excited shear mode acoustic resonator, comprising:

providing a piezoelectric layer comprising monocrystalline lithium niobate and/or monocrystalline lithium tantalate, the piezoelectric layer having a first surface and a second surface opposite to each other;

forming an acoustic mirror on the first surface; the acoustic mirror comprising at least one first acoustic reflection layer and at least one second acoustic reflection layer, the first acoustic reflection layers and the second acoustic reflection layers being alternately superimposed and one first acoustic reflection layer being closest to the piezoelectric layer, and acoustic impedance of each of the first acoustic reflection layers being less than that of each of the second acoustic reflection layers;

bonding a bearing wafer on a first surface of the acoustic mirror, the first surface of the acoustic mirror being a side facing away from the piezoelectric layer; and forming an electrode unit and a lateral reflector on the second surface; the electrode unit being used for forming an electric field, the lateral reflector comprising a first reflector located on a first side of the electrode unit and a second reflector located on a second side of the electrode unit, the first side and the second side being opposite sides, and the lateral reflector being used for laterally reflecting a sound wave;

wherein the step of forming an acoustic mirror on the first surface comprises:

depositing and etching the acoustic mirror, and depositing a filling layer on the piezoelectric layer, to fill a position where the acoustic mirror is etched away; and wherein the step of depositing and etching the acoustic mirror, and depositing the filling layer on the piezoelectric layer comprises:

step A, depositing the first acoustic reflection layer;

step B, depositing the second acoustic reflection layer on the first acoustic reflection layer;

step C, etching the second acoustic reflection layer; and sequentially repeating step A, step B, and step C till a required number of first acoustic reflection layers and second acoustic reflection layers are formed, and then depositing the filling layer.

7. The method for fabricating a laterally excited shear mode acoustic resonator according to claim 1, wherein the filling layer is made of a same material as the first acoustic reflection layer.

8. The method for fabricating a laterally excited shear mode acoustic resonator according to claim 1, wherein a material of each first acoustic reflection layer comprises at least one selected from a group consisting of silicon dioxide, aluminum, benzocyclobutene, polyimide, and spin on glass, and a material of each second acoustic reflection layer comprises at least one selected from a group consisting of molybdenum, tungsten, titanium, platinum, aluminum nitride, tungsten oxide, and silicon nitride.

9. The method for fabricating a laterally excited shear mode acoustic resonator according to claim 1, wherein after the step of bonding a bearing wafer on a first surface of the acoustic mirror, and before the step of forming an electrode unit and a lateral reflector on the second surface, the method further comprises: thinning the piezoelectric layer to a desired thickness by grinding and polishing.

10. The method for fabricating a laterally excited shear mode acoustic resonator according to claim 3, after the step of depositing and etching a second metal layer on the electrode unit to form a first metal part on the first common electrode and a second metal part on the second common electrode, the method further includes a step of forming a passivation layer on the piezoelectric layer, the passivation layer covering the first interdigitated electrodes and the second interdigitated electrodes.

11. A laterally excited shear mode acoustic resonator fabricated by the method for fabricating a laterally excited shear mode acoustic resonator according to claim 1.

* * * * *